US011552249B2

(12) United States Patent
Wang

(10) Patent No.: US 11,552,249 B2
(45) Date of Patent: Jan. 10, 2023

(54) POLYIMIDE LUMINESCENT MATERIAL, PREPARATION METHOD THEREOF, AND DEVICE THEREOF

(71) Applicant: Wuhan China Star Optoelectronics Semiconductor Display Technology Co., Ltd., Hubei (CN)

(72) Inventor: Yamin Wang, Wuhan (CN)

(73) Assignee: Wuhan China Star Optoelectronics Semiconductor Display Technology Co., Ltd., Hubei (CN)

( * ) Notice: Subject to any disclaimer, the term of this patent is extended or adjusted under 35 U.S.C. 154(b) by 323 days.

(21) Appl. No.: 16/651,746

(22) PCT Filed: Jan. 20, 2020

(86) PCT No.: PCT/CN2020/073101
§ 371 (c)(1),
(2) Date: Mar. 27, 2020

(87) PCT Pub. No.: WO2021/120368
PCT Pub. Date: Jun. 24, 2021

(65) Prior Publication Data
US 2021/0408385 A1    Dec. 30, 2021

(30) Foreign Application Priority Data

Dec. 20, 2019 (CN) .......................... 201911325216.4

(51) Int. Cl.
*H01L 51/00* (2006.01)
*C08G 73/10* (2006.01)
(Continued)

(52) U.S. Cl.
CPC ...... *H01L 51/0035* (2013.01); *C08G 73/1032* (2013.01); *C08G 73/1053* (2013.01);
(Continued)

(58) Field of Classification Search
CPC ............ H01L 51/0035; H01L 51/0089; H01L 51/0097; H01L 51/5012; H01L 2251/5338;
(Continued)

(56) References Cited

FOREIGN PATENT DOCUMENTS

| CN | 103113583 A | 5/2013 |
|---|---|---|
| CN | 105254881 A | 1/2016 |

(Continued)

OTHER PUBLICATIONS

Inorganic and Analytical Chemistry, 2007, 3 pages.
Preparation, Characterization and Fluorescence Properties of Polyimide Containing 1,10-phenanthroline and Its Rare Earth Complex, Chinese Master's Thesis Full-text database, Engineering Science and Technology I, Sep. 2015, 8 pages.
(Continued)

*Primary Examiner* — Shane Fang
(74) *Attorney, Agent, or Firm* — Luedeka Neely Group, PC

(57) ABSTRACT

A polyimide luminescent material, a preparation method, and a used thereof are disclosed; the polyimide luminescent material includes a polyimide resin and a rare earth complex distributed in the polyimide resin, wherein the polyimide resin is a condensation polymer of an aromatic diamine containing a bidentate chelate ligand and an aromatic dianhydride, and the rare earth complex and the bidentate chelate ligand are connected by a chemical bond. The luminescent material has enhanced fluorescence intensity, thermal stability, and mechanical properties. The preparation method is simple and easy, and is suitable for industrial production.

5 Claims, 1 Drawing Sheet

(51) Int. Cl.
*C09K 11/06* (2006.01)
*H01L 51/50* (2006.01)

(52) U.S. Cl.
CPC .......... *C08G 73/1071* (2013.01); *C09K 11/06* (2013.01); *H01L 51/0089* (2013.01); *C09K 2211/1425* (2013.01); *C09K 2211/1433* (2013.01); *C09K 2211/1466* (2013.01); *C09K 2211/182* (2013.01); *H01L 51/0097* (2013.01); *H01L 51/5012* (2013.01); *H01L 2251/5338* (2013.01)

(58) Field of Classification Search
CPC ............ C08G 73/1032; C08G 73/1053; C08G 73/1071; C09K 11/06; C09K 2211/1425; C09K 2211/1433; C09K 2211/1466; C09K 2211/182
See application file for complete search history.

(56) References Cited

FOREIGN PATENT DOCUMENTS

| | | |
|---|---|---|
| CN | 105254882 A | 1/2016 |
| CN | 107987277 A | 5/2018 |
| CN | 108114696 A | 6/2018 |
| CN | 108659221 A | 10/2018 |
| CN | 109320750 A | 2/2019 |
| JP | H0570592 A | 3/1993 |
| WO | 2012090827 A1 | 7/2012 |

OTHER PUBLICATIONS

Scrivanti, Alberto, et al., Luminescent europium(iii) complexes containing an electron rich 1,2,3-triazolyl-pyridyl ligand, New J. Chem, 2018, vol. 42, pp. 11064-11073.

Zhou, Yin jian, et al., Synthesis, Crystal Structure and Fluorescent Properties of a Ternary Europium Complex Eu(DBM)3 L1, Zhengzhou University, Department of Chemistry, Sep. 2005, vol. 16, No. 3.

POLYIMIDE LUMINESCENT MATERIAL, PREPARATION METHOD THEREOF, AND DEVICE THEREOF

FIELD OF THE INVENTION

The present disclosure is related to the technical field of material science, and in particular to a polyimide luminescent material, a preparation method thereof, and a device thereof.

BACKGROUND OF DISCLOSURE

With the improvement of display technology, organic light-emitting diodes (OLEDs) become one of research hotspots of the organic optoelectronic field, due to their advantages, such as active luminescence, full-color display, low power consumption, low starting voltages, high brightness, quick response times, wide viewing angles, simple processing technology, and low costs. Compared with organic small molecular luminescent material materials, polymer luminescent materials may be formed into large area films and made into flexible devices with simple structures by many low-cost technologies, such as spin-coating, ink-jet printing, impregnation. Therefore, polymer light-emitting diodes (PLEDs) based on the polymer luminescent materials will be a focus of research on the flexible printable display field in the future.

SUMMARY OF INVENTION

Technical Problems

Polyimide is a kind of high-performance polymer containing an imide ring on a main chain thereof. The polyimide is used widely in the field of an organic light-emitting diode (OLED), due to advantages such as high mechanical strength, high and low temperature tolerance, chemical corrosion resistance, desirable dimensional stability, and dielectric properties. In the prior art, less variety and low fluorescence intensity of polyimide luminescent materials lead to a limitation of an in-depth application of the polyimide luminescent materials in the new display field.

Technical Solutions

The primary purpose of the present disclosure is to provide a polyimide luminescent material with high fluorescence intensity.

In order to achieve the above purpose, the technical solution of the present disclosure is as follows: a polyimide luminescent material, including a polyimide resin and a rare earth complex distributed in the polyimide resin, wherein the polyimide resin is a condensation polymer of an aromatic diamine containing a bidentate chelate ligand and an aromatic dianhydride, and the rare earth complex and the bidentate chelate ligand are connected by a chemical bond.

Specifically, the polyimide luminescent material has a structural formula as below:

wherein a degree of polymerization n is 1000-3500; a molecular weight is 100000-350000.

Another purpose of the present disclosure is to provide a preparation method of the polyimide luminescent material as described above. The preparation method has the characteristics of simple and convenient.

The preparation method of the polyimide luminescent material includes steps of:

(1) reacting 4-amino-2,2'-bipyridine with 3,5-diaminobenzoic acid to form an aromatic diamine containing a bidentate chelate ligand;

(2) reacting the aromatic diamine containing the bidentate chelate ligand with an ether dianhydride to form a polyamide acid containing the bidentate chelate ligand;

(3) reacting the polyamide acid containing the bidentate chelate ligand with a rare earth complex to form a polyamide acid containing the rare earth complex; and (4) processing the polyamide acid containing the rare earth complex by a thermal imidization reaction to form a polyimide containing the rare earth complex.

Preferably, in the step (1), the 4-amino-2,2'-bipyridine is dissolved in a dimethylformamide (DMF) solution under a protection of nitrogen, then a reflux condensation is performed, and the DMF solution of the 4-amino-2,2'-bipyridine is cooled to 0-5° C. by an ice water bath; then a DMF solution of the 3,5-diaminobenzoic acid is slowly dropped into the DMF solution of the 4-amino-2,2'-bipyridine to obtain a mixed solution; and the obtained mixed solution is stirred and reacted under 60-90° C. for 6 to 12 hours to obtain the aromatic diamine containing the bidentate chelate ligand; wherein a reaction molar ratio of the 4-amino-2,2'-bipyridine and the 3,5-diaminobenzoic acid is (0.1-1.05):(0.1-0.95).

Preferably, in the step (2), a N-methylpyrrolidone solution of the aromatic diamine containing the bidentate chelate ligand is mixed with a N-methylpyrrolidone solution of the ether dianhydride under the protection of nitrogen to obtain a mixed solution, and the mixed solution is stirred and reacted at a room temperature for 16 to 48 hours to obtain the polyamide acid containing the bidentate chelate ligand; wherein a reaction molar ratio of the aromatic diamine containing the bidentate chelate ligand and the ether dianhydride is (0.1-1.05):(0.1-1.05).

Preferably, the ether dianhydride in the step (2) is

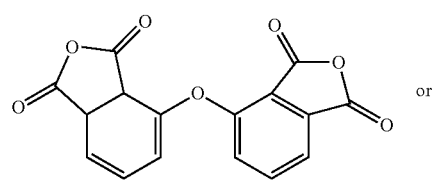

or

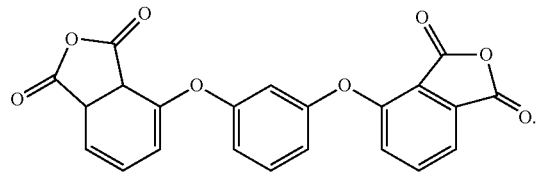

Preferably, the rare earth complex in the step (3) is Eu(DBM)₃L, and the structural formula is:

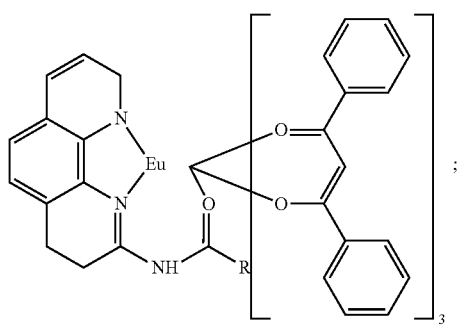

wherein the Eu is optionally replaced by one of Ce, Pr, and Er.

Preferably, in the step (3), the rare earth complex is fully dissolved in a DMF and then slowly added into the polyamide acid containing the bidentate chelate ligand to obtain a mixed solution; and the obtained mixed solution is stirred and reacted for 16 to 48 hours to form the polyamide acid containing the rare earth complex; wherein a reaction molar ratio of the rare earth complex and the polyamide acid containing the bidentate chelate ligand is 0.75-1.75.

Preferably, in the step (4), the polyamide acid containing the rare earth complex is heated to 80° C., spin-coated on a clean glass substrate, removed a portion of solvents by heating at 120° C., heated up to 450° C. at a gradient rate of 4-8° C./min, and then heated at constant temperature of 450° C. for 0.8 to 1.2 hours, so as to obtain the polyimide containing a europium coordination.

Still another purpose of the present disclosure is to provide a photoluminescent or flexible electroluminescent device, including the polyimide luminescent material as described above.

Beneficial Effects:

Beneficial effects of the present disclosure are as follows: a polyimide luminescent material with enhanced fluorescence intensity, strong thermal stability, and excellent mechanical properties is provided. Furthermore, the polyimide luminescent material has the potential for further preparing a luminescent layer of products such as photoluminescent products and flexible electroluminescent devices. The preparation method of the present disclosure is simple and easy, and is suitable for industrial production.

DETAILED DESCRIPTION OF EMBODIMENTS

Figure 1:
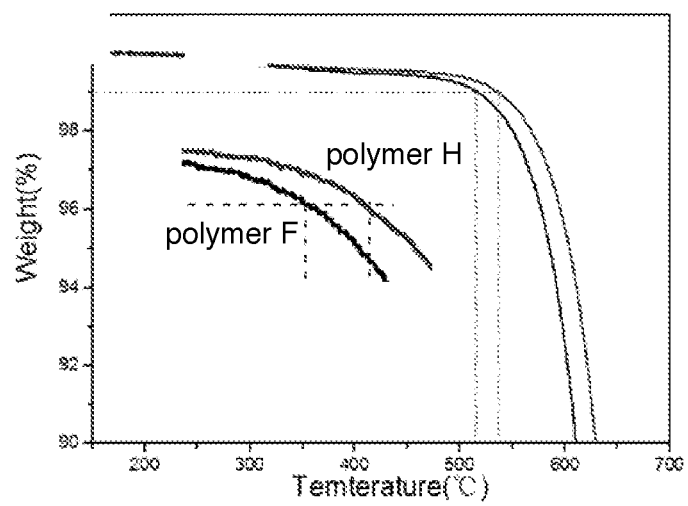
FIG. 1 is a thermogravimetric analysis (TGA) curve graph of a polyimide containing a bidentate chelate ligand and polyimide containing europium coordination.

The present disclosure is further illustrated by the following embodiments 1-2.

Embodiment 1: a polyimide luminescent material is prepared, including steps of:

(1) weighing 0.65 g of 4-amino-2,2'-bipyridine (compound A), stirring and dissolving compound A in a 10 ml of a dimethylformamide (DMF) solution under a protection of nitrogen, then performing a reflux condensation, cooling materials to 0° C. by an ice water bath; weighing 1.43 g of 3,5-diaminobenzoic acid (compound B), stirring and dissolving compound B in a 15 ml of the DMF solution, slowly dropping the 3,5-diaminobenzoic acid into a 4-amino-2,2'-bipyridine solution by a constant pressure dropping funnel to obtain a filtrate; then naturally restoring the materials to room temperature, stirring and reacting the filtrate under 60° C. for 12 hours, washing the filtrate with a boiling ethanol until the filtrate is colorless after the reaction, and finally removing solvents of the filtrate by rotary evaporation to obtain an aromatic diamine containing a bidentate chelate ligand;

(2) weighing 0.93 g of the aromatic diamine containing the bidentate chelate ligand, stirring and dissolving the aromatic diamine containing the bidentate chelate ligand in a 10 ml of a N-methylpyrrolidone solution under the protection of nitrogen; weighing 1.2 g of an ether dianhydride, stirring and dissolving the ether dianhydride in the 10 ml of the N-methylpyrrolidone solution; mixing the N-methylpyrrolidone solution of the aromatic diamine containing the bidentate chelate ligand with the N-methylpyrrolidone solution of the ether dianhydride to obtain a mixed solution, and stirring and reacting the mixed solution under a room temperature for 32 hours to obtain a polyamide acid containing the bidentate chelate ligand;

(3) weighing 2.1 g of a Eu(DBM)₃L, fully dissolving the Eu(DBM)₃L in a 10 ml of the DMF solution, slowly adding the materials into the polyamide acid containing the bidentate chelate ligand described above to obtain a mixed solution, and stirring and reacting the mixed solution under a constant temperature for 24 hours to obtain a polyamide acid containing a europium coordination; and (4) heating the polyamide acid containing the europium coordination to 80° C., spin-coating the polyamide acid containing the europium coordination on a clean glass substrate, removing 70% of solvents by heating at 120° C. in a vacuum oven, then heating up to 450° C. at a gradient rate of 4° C./min, and heating at constant temperature of 450° C. for 0.8 hours, so as to obtain a polyimide containing the europium coordination.

In a technical solution described above, a structural formula of the aromatic diamine containing the bidentate chelate ligand is

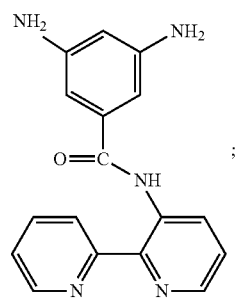 [SMILES: Nc1cc(N)cc(C(=O)Nc2cccnc2-c2ccccn2)c1]

a structural formula of the ether dianhydride is
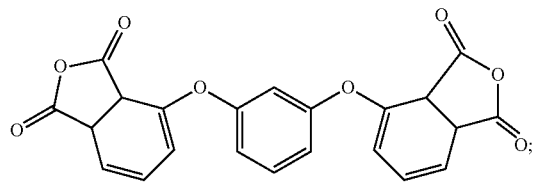 [SMILES: O=C1OC(=O)C2C(Oc3cccc(OC4=CC=CC5C(=O)OC(=O)C45)c3)=CC=CC12]
a structural formula of the polyamide acid containing the bidentate chelate ligand is
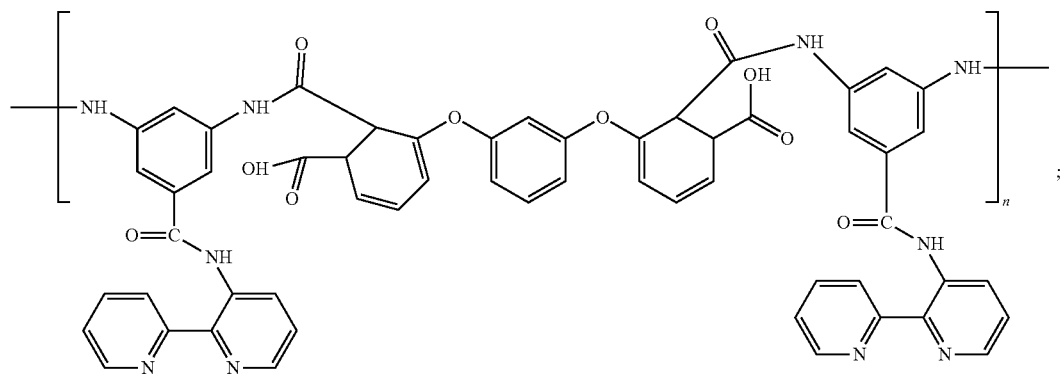
a structural formula of the Eu(DBM)$_3$L is
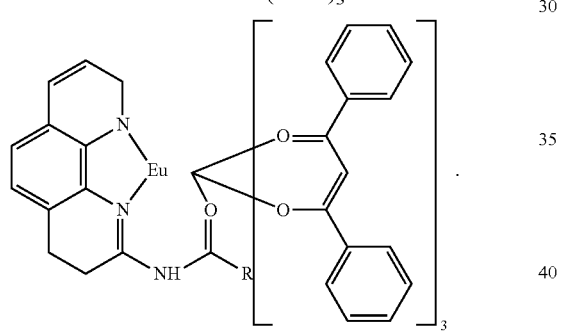
a structural formula of the polyamide acid containing the europium coordination is
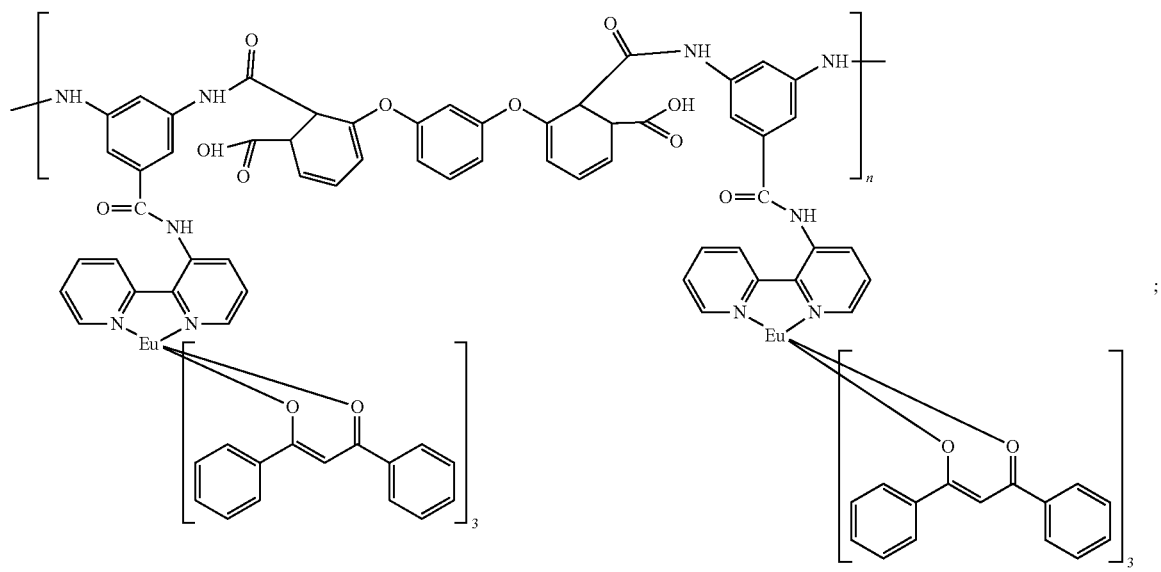

a structural formula of the polyimide containing the europium coordination is

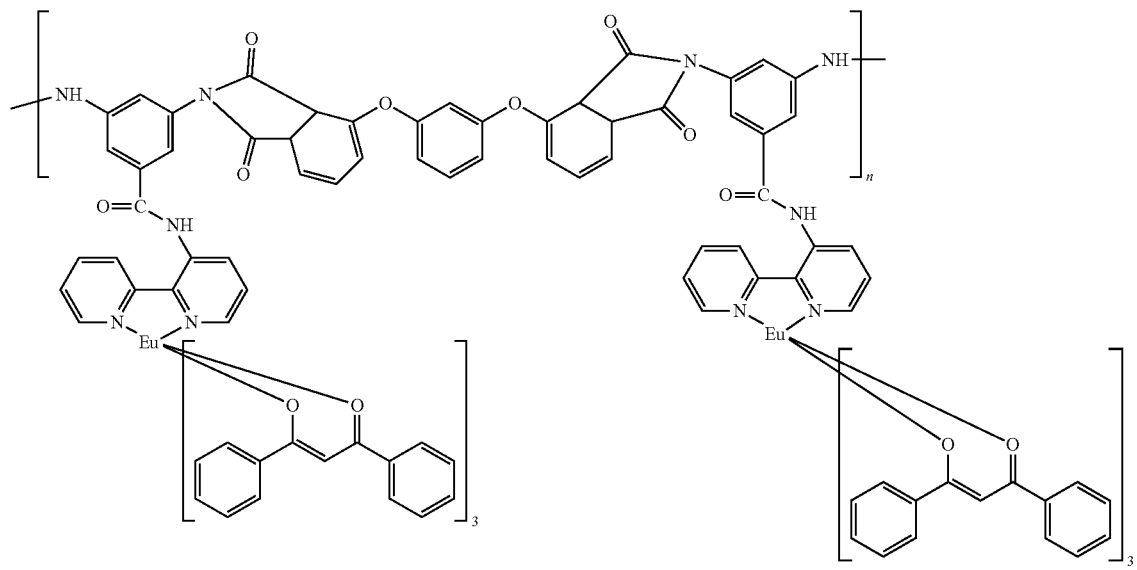

Embodiment 2: a polyimide luminescent material is prepared, including steps of:

(1) weighing 1.35 g of 4-amino-2,2'-bipyridine (compound A), stirring and dissolving compound A in a 25 ml of a dimethylformamide (DMF) solution under a protection of nitrogen, then performing a reflux condensation, and cooling materials to 0° C. by an ice water bath; weighing 2.05 g of 3,5-diaminobenzoic acid (compound B), stirring and dissolving compound B in a 15 ml of the DMF solution, slowly dropping the 3,5-diaminobenzoic acid into a 4-amino-2,2'-bipyridine solution by a constant pressure dropping funnel to obtain a filtrate; then naturally restoring the materials to room temperature, stirring and reacting the filtrate under 80° C. for 10 hours, washing the filtrate with a boiling ethanol until the filtrate is colorless after the reaction, and finally removing solvents of the filtrate by rotary evaporation to obtain an aromatic diamine containing a bidentate chelate ligand;

(2) weighing 1.52 g of the aromatic diamine containing the bidentate chelate ligand, stirring and dissolving the aromatic diamine containing the bidentate chelate ligand in a 10 ml of a N-methylpyrrolidone solution under the protection of nitrogen; weighing 2.8 g of an ether dianhydride, stirring and dissolving the ether dianhydride in the 10 ml of the N-methylpyrrolidone solution; mixing the N-methylpyrrolidone solution of the aromatic diamine containing the bidentate chelate ligand with the N-methylpyrrolidone solution of the ether dianhydride to obtain a mixed solution, and stirring and reacting the mixed solution at a room temperature for 16 to 48 hours to obtain a polyamide acid containing the bidentate chelate ligand;

(3) weighing 3.6 g of a Eu(DBM)$_3$L, fully dissolving the Eu(DBM)$_3$L in a 25 ml of the DMF solution, slowly adding the materials into the polyamide acid containing the bidentate chelate ligand described above to obtain a mixed solution, and stirring and reacting the mixed solution at a constant temperature for 24 hours to obtain a polyamide acid containing a europium coordination; and (4) heating the polyamide acid containing the europium coordination to 80° C., spin-coating the polyamide acid containing the europium coordination on a clean glass substrate, removing 70% of solvents by heating at 120° C. in a vacuum oven, then heating up to 450° C. at a gradient rate of 4° C./min, and heating at constant temperature of 450° C. for 0.8 hours, so as to obtain a polyimide containing the europium coordination.

Comparative Embodiment 1

The same amount of the polyamide acid containing the bidentate chelating ligand as in embodiment 1 is taken, heated to 80° C., spin-coated on a clean glass substrate, removed 70% of solvents by heating at 120° C. in a vacuum oven, then heated up to 450° C. at a gradient rate of 4-8° C./min, and then heated at constant temperature of 450° C. for 0.8 to 1.2 hours, so as to obtain a polyimide containing a bidentate chelate ligand. A structural formula of the polyimide containing the bidentate chelate ligand is

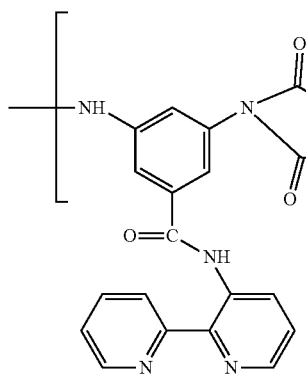 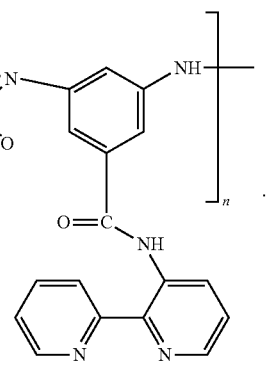

Thermal Stability Test:

The polyimide containing the europium coordination obtained by the embodiment 1 and the polyimide containing the bidentate chelate ligand obtained by the comparative embodiment 1 are subjected to a thermogravimetric analysis respectively, and a result is shown in FIG. 1. In FIG. 1, a polymer F is the polyimide containing the bidentate chelate ligand (lines in a dark color), and a polymer H is the polyimide containing the europium coordination (lines in a light color). Refer to FIG. 1, a temperature of 1% of thermogravimetric analysis (TGA) weight loss of the polymer F is 516.8° C., and a temperature of 1% of the TGA weight loss of the polymer H is 535.8° C. That is, the temperature of the TGA weight loss of the polyimide containing the europium coordination is higher than the temperature of the polyimide containing the bidentate chelate ligand without a rare earth element, and a thermal stability of the polymer H is stronger than a thermal stability of the polymer F. In fact, most of the rare earth complexes introduced in the aromatic diamine containing bidentate chelate ligand are aromatic rings which also exist as large side groups. Therefore, it is conducive to increase the thermal stability of the aromatic diamine containing bidentate chelate ligand to some extent.

Figure 2:
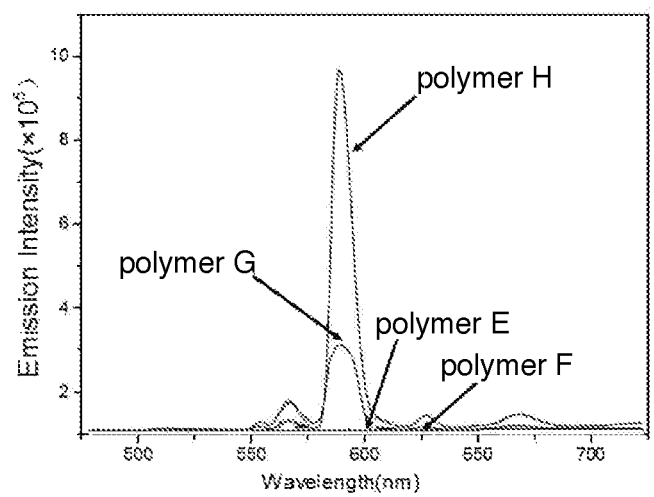
FIG. 2 is an emission map of a polyamide acid containing the bidentate chelate ligand, the polyimide containing the bidentate chelate ligand, an Eu(DBM)₃L, and the polyimide containing the europium coordination.

Fluorescence Intensity Test:

The polyamide acid containing the bidentate chelate ligand, the polyimide containing the bidentate chelate ligand, the Eu(DBM)$_3$L, and the polyimide containing the europium coordination are subjected to a fluorescence spectroscopy analysis respectively, and a result is shown in FIG. 2. In FIG. 2, a polymer E is the polyamide acid containing the bidentate chelate ligand; a polymer F is the polyimide containing the bidentate chelate ligand; a compound G is the Eu(DBM)$_3$L; a polymer H is the polyimide containing the europium coordination. Refer to FIG. 2, when an excitation wavelength of the polymer H is 200-450 nm, the polymer H optionally emits a red fluorescence at 590 nm with a desirable monochromaticity, high luminous intensity, and typical characteristics of europium ion. Moreover, it is found that the fluorescence intensity of the polymer H at 590 nm is about 3.5-5.5 times than the fluorescence intensity of the compound G by comparing the fluorescence intensity of the compound G (Eu(DBM)$_3$L) with the fluorescence intensity of the polymer H.

In summary, a person skilled in the art can make various modifications and refinements according to the technical solutions and the technical conceptions of the present disclosure, and all of these modifications and refinements shall belong to the scope of protection of the claims of the present disclosure.

INDUSTRIAL APPLICABILITY

The subject matter of present disclosure may be prepared and used in industry, and has industrial practicability.

What is claimed is:

1. A preparation method of a polyimide luminescent material, comprising steps of:
   (1) reacting 4-amino-2,2'-bipyridine with 3,5-diaminobenzoic acid to form an aromatic diamine containing a bidentate chelate ligand;
   (2) reacting the aromatic diamine containing the bidentate chelate ligand with an ether dianhydride to form a polyamide acid containing the bidentate chelate ligand, wherein the ether dianhydride in the step (2) is

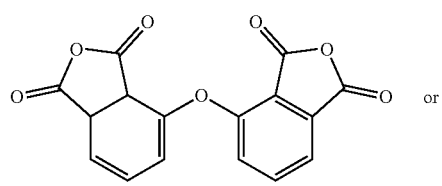 or

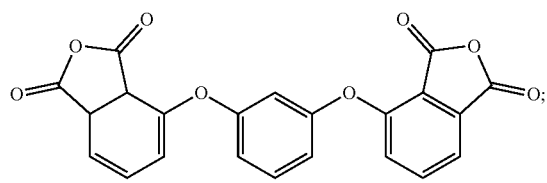

(3) reacting the polyamide acid containing the bidentate chelate ligand with a rare earth complex to form a polyamide acid containing the rare earth complex, the rare earth complex in the step (3) is Eu(DBM)₃L, and the structural formula is:

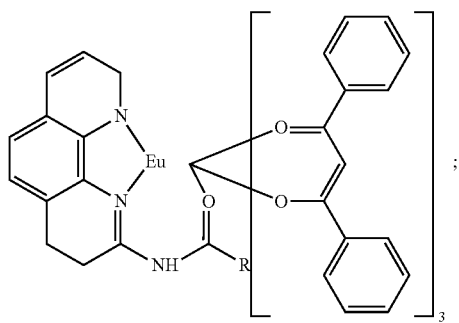

wherein the DBM is dibenzoylmethane, the L is phenanthroline ligands, and the Eu is optionally replaced by one of Ce, Pr, and Er; and (4) processing the polyamide acid containing the rare earth complex by a thermal imidization reaction to form a polyimide containing the rare earth complex.

2. The preparation method of the polyimide luminescent material as claimed in claim 1, wherein in the step (1), the 4-amino-2,2'-bipyridine is dissolved in a dimethylformamide (DMF) solution under a protection of nitrogen, then a reflux condensation is performed, and the DMF solution of the 4-amino-2,2'-bipyridine is cooled to 0-5° C. by an ice water bath; then a DMF solution of the 3,5-diaminobenzoic acid is slowly dropped into the DMF solution of the 4-amino-2,2'-bipyridine to obtain a mixed solution; and the obtained mixed solution is stirred and reacted under 60-90° C. for 6 to 12 hours to obtain the aromatic diamine containing the bidentate chelate ligand; wherein a reaction molar ratio of the 4-amino-2,2'-bipyridine and the 3,5-diaminobenzoic acid is (0.1-1.05):(0.1-0.95).

3. The preparation method of the polyimide luminescent material as claimed in claim 1, wherein in the step (2), a N-methylpyrrolidone solution of the aromatic diamine containing the bidentate chelate ligand is mixed with a N-methylpyrrolidone solution of the ether dianhydride under the protection of nitrogen to obtain a mixed solution, and the mixed solution is stirred and reacted at a room temperature for 16 to 48 hours to obtain the polyamide acid containing the bidentate chelate ligand; wherein a reaction molar ratio of the aromatic diamine containing the bidentate chelate ligand and the ether dianhydride is (0.1-1.05):(0.1-1.05).

4. The preparation method of the polyimide luminescent material as claimed in claim 1, wherein in the step (3), the rare earth complex is fully dissolved in a DMF and then slowly added into the polyamide acid containing the bidentate chelate ligand to obtain a mixed solution;

and the obtained mixed solution is stirred and reacted for 16 to 48 hours to form the polyamide acid containing the rare earth complex; wherein a reaction molar ratio of the rare earth complex and the polyamide acid containing the bidentate chelate ligand is 0.75-1.75.

5. The preparation method of the polyimide luminescent material as claimed in claim 1, wherein in the step (4), the polyamide acid containing the rare earth complex is heated to 80° C., spin-coated on a clean glass substrate, heated at 120° C. for removing a portion of solvents, heated up to 450° C. at a gradient rate of 4-8° C./min, and then heated at constant temperature of 450° C. for 0.8 to 1.2 hours, so as to obtain the polyimide containing a europium coordination.

* * * * *